United States Patent [19]

Stringfellow

[11] Patent Number: 4,482,871
[45] Date of Patent: Nov. 13, 1984

[54] WIDEBAND VCO INCLUDING VARIABLE CAPACITIVE OUTPUT COUPLING VARACTOR FOR CONSTANT POWER OUTPUT

[75] Inventor: Martin S. Stringfellow, Tempe, Ariz.

[73] Assignee: Motorola Inc., Schaumburg, Ill.

[21] Appl. No.: 393,146

[22] Filed: Jun. 28, 1982

[51] Int. Cl.³ .......................... H03B 7/14; H03B 9/14
[52] U.S. Cl. ................................ 331/101; 331/107 C;
                                               331/177 V; 332/30 V
[58] Field of Search ........... 331/36 C, 96, 101, 107 C,
                              331/107 DP, 117 D, 177 B; 332/30 V

[56] References Cited

U.S. PATENT DOCUMENTS

| | | | |
|---|---|---|---|
| 3,599,118 | 8/1971 | Large | 331/96 |
| 3,665,339 | 5/1972 | Liu | 331/96 |
| 3,789,322 | 1/1974 | Reynolds | 331/96 |

FOREIGN PATENT DOCUMENTS 0992645  5/1965  United Kingdom ............. 331/36 C

Primary Examiner—Siegfried H. Grimm
Assistant Examiner—D. C. Mis
Attorney, Agent, or Firm—Eugene A. Parsons

[57] ABSTRACT

A wideband VCO including a coaxial cavity with a negative impedance semiconductor diode and a tuning varactor mounted in a center conductor thereof. A variable bias circuit connected to the tuning varactor for tuning the VCO through a predetermined range. An output probe including a coupling varactor in contact with the center conductor. The variable bias circuit is coupled to the coupling varactor to alter the output coupling capacity as the frequency of the oscillator changes so that the output power remains substantially constant.

6 Claims, 5 Drawing Figures

U.S. Patent   Nov. 13, 1984   4,482,871
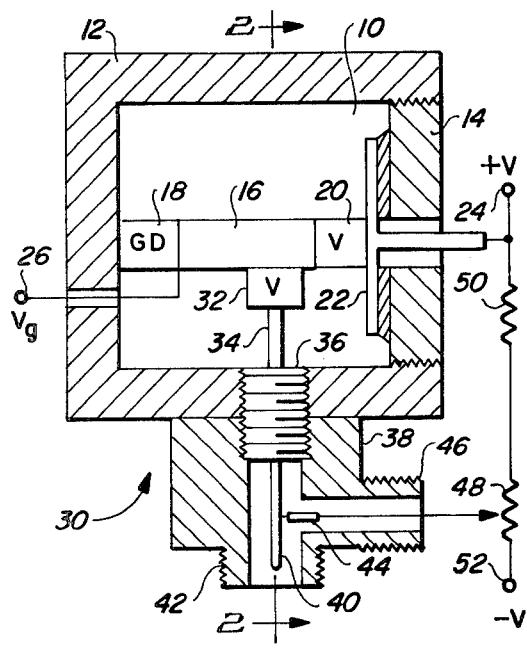
_Fig-1_
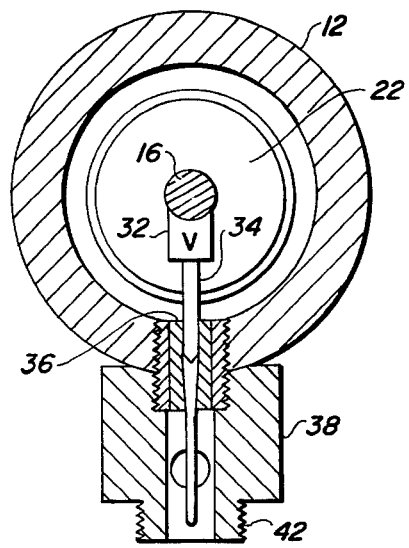
_Fig-2_
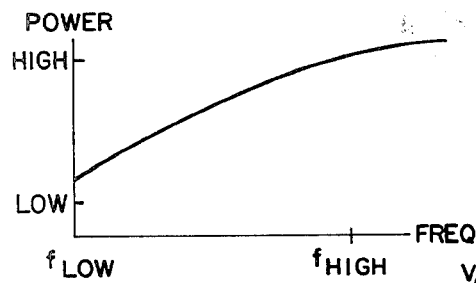
_Fig-3_
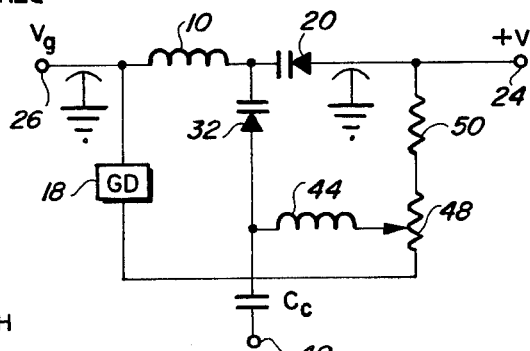
_Fig-5_
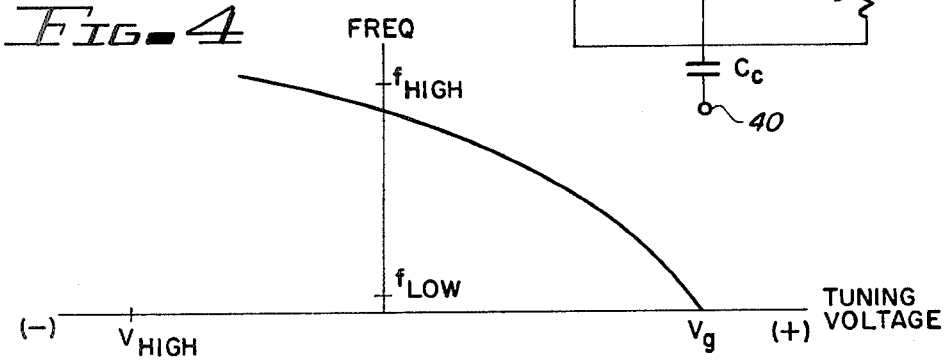
_Fig-4_

WIDEBAND VCO INCLUDING VARIABLE CAPACITIVE OUTPUT COUPLING VARACTOR FOR CONSTANT POWER OUTPUT

BACKGROUND OF THE INVENTION

A major problem in obtaining good performance from a wideband voltage controlled oscillator (VCO) is maintaining optimum coupling of power output over the tuned bandwidth. The most conventional output coupling method is a capacitive probe. The power output of the VCO increases with frequency because the capacitive probe reactance decreases with frequency since the probe capacitance is essentially constant. Typically, the capacitive probe is adjusted for near maximum coupling at the high frequencies of the VCO and the resulting power reduction at the low frequencies of the VCO is tolerated. If the capacitive probe is adjusted for more power at the low frequencies of the oscillator, the oscillator will either mode switch near the high frequency or the upper frequency will decrease because the VCO is now over-coupled at the high frequency. Thus, it is extremely difficult to provide a wideband VCO with substantially constant power output.

SUMMARY OF THE INVENTION

The present invention pertains to a wideband resonant cavity VCO with capacitive coupling output apparatus wherein a coupling varactor is used as the capacitive coupling and a variable bias circuit adjusts the capacity of the VCO is varied to maintain the power output substantially constant.

It is an object of the present invention to provide a new and improved wideband VCO for providing substantially constant power output.

It is a further object of the present invention to provide new and improved coupling apparatus for a wideband resonant cavity VCO wherein the capacity of the coupling is adjusted over the range of the VCO to maintain the output power substantially constant.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a sectional view of a wideband resonant cavity VCO embodying the present invention;

FIG. 2 is a sectional view of the oscillator of FIG. 1 as seen from the line 2—2;

FIG. 3 is a graph depicting the power output v. frequency of a wideband resonant cavity VCO with a fixed capacity output probe;

FIG. 4 is a graph depicting the VCO tuning characteristics as a function of tuning voltage for an abrupt junction tuning varactor; and FIG. 5 is a schematic diagram representing an equivalent circuit for the VCO of FIG. 1.

DESCRIPTION OF THE PREFERRED EMBODIMENT

Referring specifically to FIGS. 1 and 2, a resonant cavity 10 is defined by a cup shaped housing 12 and cover 14 threadedly engaged therein. In this particular embodiment the resonant cavity is formed as a coaxial cavity with a center conductor 16 positioned therein. The center conductor 16 extends through the resonant cavity 10 along the axis of the cup shaped housing 12 and cover 14. The innermost end of the center conductor 16 is electrically and physically engaged to one end of a semiconductor diode 18, the other end of which is electrically and physically attached to the inner surface of the housing 12. The semiconductor diode 18 is the active element of the VCO and may be, for example, any of the well known negative impedance semiconductor devices including a Gunn diode, an IMPATT diode, etc. The opposite end of the center conductor 16 is electrically and physically engaged to one side of a frequency tuning varactor diode 20. A varactor diode, as is well known, comprises a back biased p-n junction diode, the capacitance of which varies as a function of dc bias voltage applied thereto. The opposite side of the varactor 20 is physically and electrically connected through an RF choke 22. The RF choke 22, in this embodiment, is a disc mounted internal to the cavity 10 and parallel to the cover 14 with an axially extending electrical connector positioned to extend through an opening in the cover 14 external of the cavity 10. The choke 22 is insulated from the cover 14 and has a dc voltage applied thereto by means of an external terminal 24. The RF choke 22 allows a dc bias voltage to be applied to the varactor 20 from the external terminal 24 while acting as an RF short to prevent high frequencies (RF) from emanating to the external terminal 24. It will be understood that other types of RF chokes, such as the well known dumb bell device, might be utilized in place of the choke 22 if desired. An external terminal 26 is electrically connected through the housing 12 to the center conductor 16 for applying a bias voltage thereto. The bias voltage is a fixed operating voltage for the semiconductor diode 18 and, also, holds the inner side of the varactor diode 20 at a fixed voltage.

Output power coupling apparatus, generally designated 30, includes a capacitive probe and a circuit for applying a bias voltage thereto. A coupling varactor 32, which provides the capacity for the capacitive probe, has one end electrically and physically connected to the center conductor 16 and the other end externally available by way of a connecting rod 34 and a coupler 36. The coupler 36 is threadedly engaged through an opening in the housing 12 and a bias T 38 is threadedly engaged thereon external to the housing 12. A center conductor 40 in the bias T is electrically connected to the rod 34 and serves as the center conductor of an external connector 42 adapted to receive a coaxial cable or the like thereon. The center conductor 40 is also connected through an RF choke 44, illustrated schematically, and a second external connector 46 of the bias T, to the moveable arm of a variable resistor 48, external to the bias T 38. The choke 44 allows a dc bias to be applied from the external resistor 48 to the center conductor 40 and, hence, the varactor 32. One end of the resistor 48 is connected through a current limiting resistor 50 to the terminal 24 having a positive bias voltage applied thereto and the other end of the resistor 48 is connected to a terminal 52 having a negative voltage applied thereto. Thus, the voltage applied to the varactor 32 is dependent upon the setting of the moveable arm of the resistor 48 and the voltage applied to the terminals 24 and 52. If the voltage applied to the terminal 24 is varied to alter the frequency of the oscillator, by changing the capacitance of the varactor 20, the voltage on the varactor 32 will also be varied. The bias T 38 is a commercially available item and, therefore, is illustrated partially in schematic form for simplicity of understanding.

FIG. 3 illustrates the power-frequency characteristic of the VCO when the capacitance of the output power capacitive probe is maintained constant. As can be seen from the figure, the power output increases with frequency because the capacitive probe reactance decreases with frequency. FIG. 4 illustrates the VCO tuning characteristic as a function of tuning voltage applied to terminal 24. By applying the tuning voltage from terminal 24 across the resistor 48 and adjusting the resistor 48 for the correct amount of voltage at the varactor 32, the capacitance of the varactor 32 is varied with the tuning voltage and, hence, the reactance of the capacitive probe will remain substantially constant so that the power output at the output connector 42 of the bias T 38 remains substantially constant.

For simplicity of construction, the varactor 20 is illustrated as a portion of the central conductor of the resonant cavity. A fixed voltage can then be applied to one side of each of the varactors 20 and 32 by way of the terminal 26 and the center conductor 16. It will of course be understood by those skilled in the art that other embodiments could be developed wherein the tuning varactor 20 is not included as a portion of the center conductor but is included elsewhere in the resonant cavity, see for example the teaching of U.S. Pat. No. 3,789,322, issued Jan. 29, 1974, and entitled "Microwave Cavity Tuning Loop Including a Varactor".

FIG. 5 is an equivalent circuit of the VCO illustrated in FIGS. 1 and 2. Components of FIG. 5 which are similar to components in FIGS. 1 and 2 have been given similar numbers.

While a VCO with a coaxial resonant cavity is illustrated, it should be understood by those skilled in the art that other types of resonant cavities might be incorporated with a capacitive probe being utilized as the power output coupling apparatus. Further, the structure is applicable to other types of VCO's wherein the resonant cavity resonator is replaced by a resonator formed by stripline, micro-strip, waveguide, etc.

Thus, an optimum coupling scheme for wideband VCO's is disclosed wherein the capacity of the output coupling apparatus is adjusted over the range of the VCO to maintain the output power substantially constant. This scheme also provides a wider tuning range mainly due to an increase in the high frequency. In addition greater power output over the tuned bandwidth, better performance over temperature variations, minimizing high frequency mode switching, and lower phase noise at high frequencies is provided.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. In a wideband voltage controlled oscillator including a resonator with a semiconductor diode and a tuning varactor, coupling apparatus for providing substantially constant power output comprising:
    an output coupling probe with an external connection thereto for coupling power from the resonator;
    an output coupling varactor mounted in said output coupling probe; and
    a variable bias circuit coupled to said coupling varactor for varying the bias on said varactor and, therefore, the frequency response of said varactor.

2. Apparatus as claimed in claim 1 wherein the variable bias circuit is coupled to the tuning varactor and the coupling varactor for supplying bias voltages thereto which bias voltages are varied in accordance with a desired output frequency of said voltage controlled oscillator.

3. Apparatus as claimed in claim 1 wherein the resonator is a coaxial cavity and the semiconductor diode and tuning varactor are mounted in a center conductor of the coaxial cavity and the coupling varactor is mounted in electrical contact with the center conductor.

4. A wideband voltage controlled oscillator providing substantially constant power output, comprising
    a coaxial cavity having a center conductor;
    a semiconductor diode mounted in the center conductor to form an active element of the voltage controlled oscillator;
    a tuning varactor electrically coupled to said cavity for tuning the frequency of the voltage controlled oscillator in response to a tuning voltage applied to said tuning varactor;
    an output coupling varactor mounted in an output coupling probe with an external connection to said output coupling probe for coupling power from the coaxial cavity; and
    a variable bias circuit coupled to said tuning and coupling varactors for varying the bias thereon to control the voltage controlled oscillator to a desired frequency.

5. A wideband voltage controlled oscillator as claimed in claim 4 wherein said tuning varactor is mounted in the center conductor and the coupling varactor is mounted in the cavity in electrical connection with the center conductor.

6. In a wideband resonator voltage controlled oscillator, capacitive coupling output apparatus comprising a coupling varactor providing the capacitive coupling and a variable bias circuit coupled to said varactor for varying the capacity thereof as the frequency of the voltage controlled oscillator varies to maintain the power output substantially constant.

* * * * *